(12) United States Patent
Song et al.

(10) Patent No.: US 9,570,511 B2
(45) Date of Patent: Feb. 14, 2017

(54) ELECTRONIC DEVICE HAVING BURIED GATE AND METHOD FOR FABRICATING THE SAME

(71) Applicant: SK hynix Inc., Icheon-Si (KR)

(72) Inventors: Seok-Pyo Song, Icheon-Si (KR); Sung-Woong Chung, Icheon-Si (KR); Jong-Han Shin, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/143,540

(22) Filed: Apr. 30, 2016

(65) Prior Publication Data

US 2016/0247856 A1 Aug. 25, 2016

Related U.S. Application Data

(62) Division of application No. 14/188,576, filed on Feb. 24, 2014, now Pat. No. 9,331,267.

(30) Foreign Application Priority Data

Mar. 4, 2013 (KR) ........................ 10-2013-0022793

(51) Int. Cl.
*G11C 11/00* (2006.01)
*H01L 27/22* (2006.01)
*H01L 43/02* (2006.01)
*H01L 43/08* (2006.01)
*G11C 13/00* (2006.01)
(Continued)

(52) U.S. Cl.
CPC ............ *H01L 27/228* (2013.01); *G06F 3/061* (2013.01); *G06F 3/0659* (2013.01); *G06F 3/0685* (2013.01); *G06F 12/0802* (2013.01); *G06F 13/28* (2013.01); *G11C 13/0002* (2013.01); *H01L 43/02* (2013.01); *H01L 43/08* (2013.01); *G06F 2212/60* (2013.01)

(58) Field of Classification Search
CPC .................................................. G11C 13/0002
USPC .......................................................... 365/148
See application file for complete search history.

(56) References Cited

U.S. PATENT DOCUMENTS

2009/0072289 A1* 3/2009 Kim .................. H01L 21/82345
257/298
2010/0193901 A1 8/2010 Jang et al.
(Continued)

FOREIGN PATENT DOCUMENTS

| KR | 10-2011-0003039 | 1/2011 |
|---|---|---|
| KR | 10-2011-0098386 | 9/2011 |
| KR | 10-1068302 B1 | 9/2011 |

*Primary Examiner* — Hoai V Ho
(74) *Attorney, Agent, or Firm* — Perkins Coie LLP

(57) ABSTRACT

Electronic devices having semiconductor elements and methods for fabricating such devices including, a method for fabricating an electronic device including a semiconductor memory, which includes: forming a sacrificial layer on a substrate including a first region and a second region; selectively etching the sacrificial layer and the substrate of the first region to form a trench; forming a first gate that fills a part of the trench in the first region; forming a gate protection layer on the first gate to fill the remaining part of the trench; removing the sacrificial layer of the first region to form a grooved portion surrounded by the gate protection layer; forming a conductive plug to cover the grooved portion; removing the sacrificial layer of the second region; and forming a second gate on the substrate of the second region.

9 Claims, 10 Drawing Sheets

(51) Int. Cl.
*G06F 3/06* (2006.01)
*G06F 12/08* (2016.01)
*G06F 13/28* (2006.01)

(56) References Cited

U.S. PATENT DOCUMENTS

2012/0091518 A1  4/2012  Sukekawa
2012/0164812 A1  6/2012  Ryu et al.

* cited by examiner

ELECTRONIC DEVICE HAVING BURIED GATE AND METHOD FOR FABRICATING THE SAME

CROSS-REFERENCE TO RELATED APPLICATIONS

This present application is a divisional of, and claims priority and benefits of, U.S. patent application Ser. No. 14/188,576, published as US 2014/0247647, entitled "ELECTRONIC DEVICE AND METHOD FOR FABRICATING THE SAME," and filed on Feb. 24, 2014, which further claims priority of Korean Patent Application No. 10-2013-0022793, entitled "SEMICONDUCTOR DEVICE AND METHOD FOR FABRICATING THE SAME, AND MICRO PROCESSOR, PROCESSOR, SYSTEM, DATA STORAGE SYSTEM AND MEMORY SYSTEM INCLUDING THE SEMICONDUCTOR DEVICE," and filed on Mar. 4, 2013. The contents of the before-mentioned patent applications (including US 2014/0247647) are incorporated herein by reference in their entirety as part of the disclosure of this document.

TECHNICAL FIELD

This patent document relate to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research has and development for such semiconductor devices have been conducted. Examples of such semiconductor devices include semiconductor devices which can store data using a characteristic switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the improvement of characteristics of a transistor is possible, and the degree of process difficulty can be reduced by substantially preventing the occurrence of a step difference between regions difference from each other, and a fabricating method thereof.

In one aspect, a method for fabricating an electronic device including a semiconductor memory includes: forming a sacrificial layer on a substrate including a first region and a second region; selectively etching the sacrificial layer and the substrate of the first region to form a trench for a gate; forming a first gate that fills a part of the trench; forming a gate protection layer, which fills a remainder of the trench, on the first gate; removing the sacrificial layer of the first region; forming a conductive plug in a space from which the sacrificial layer has been removed; removing the sacrificial layer of the second region; and forming a second gate on the substrate of the second region.

Implementations of the above method may include one or more of the following.

The conductive plug may include a metal-containing layer.

The method may further include: forming a metal semiconductor compound layer between the conductive plug and the substrate.

The method may further include: forming an etching stop layer between the substrate and the sacrificial layer.

The method may further include: before the forming of the trench, selectively etching the sacrificial layer and the substrate of the first region to form an isolation trench and an active region which cross the trench; and forming an isolation layer that fills the isolation trench.

The forming of the trench may include: deeply etching the isolation layer, which is exposed by a mask pattern for forming the trench, more than the active region.

The forming of the first gate may include: forming conductive material that covers a resultant structure including the trench; and performing an etch-back of the conductive material such that the conductive material is equal to or less than a surface of the substrate.

The contact plug may include a first contact plug and a second contact plug which are disposed at both sides of the first gate, respectively, and the method may further include: forming a resistance variable element that is connected to the first contact plug.

The forming of the resistance variable element may include: forming a single layer or a multi-layer including metal oxide, phase change material, ferroelectric material, or ferromagnetic material; and patterning the single layer or the multi-layer.

In another aspect, an electronic device including a semiconductor memory is provided, wherein the semiconductor memory includes: a substrate including a first region and a second region; a stack structure in which a first gate and a gate protection layer are stacked, wherein a part of the stack structure is buried in the substrate and a remainder of the stack structure protrudes above the substrate, in the first region; a conductive plug disposed at a side of the stack structure, on the substrate of the first region; and a second gate disposed on the substrate of the second region.

Implementations of the above electronic device may include one or more the following.

The conductive plug may include a metal-containing layer.

The electronic device may further include a metal semiconductor compound layer interposed between the conductive plug and the substrate.

The substrate of the first region may include an active region and an isolation layer extending in a first direction, wherein the stack structure extends in a second direction crossing the first direction, and wherein the active region below the first gate protrudes above the isolation layer.

The first gate may be positioned under a surface of the substrate.

The contact plug may include a first contact plug and a second contact plug which are disposed at both sides of the first gate, respectively, and the device may further include: a resistance variable element that is connected to the first conductive plug.

The resistance variable element may include: a single layer or a multi-layer including metal oxide, phase change material, ferroelectric material, or ferromagnetic material.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, an electronic device including a semiconductor memory is provided. The semiconductor memory includes: a substrate including a first region and a second region; a stacked structure of a first gate and a gate protection layer that are formed in the first region such that a part of the stacked structure is buried in the substrate; a conductive plug disposed on the substrate of the first region and in at a side of the stacked structure; and a second gate disposed on the substrate of the second region.

Implementations of the above electronic device may include one or more the followings.

The conductive plug may include a metal-containing layer.

The electronic device may further include a metal semiconductor compound layer interposed between the conductive plug and the substrate.

The substrate of the first region may include an active region and an isolation layer extending in a first direction, wherein the stacked structure extends in a second direction crossing the first direction, and wherein a surface of the active region below the first gate is higher than a surface of the isolation layer below the first gate.

The first gate may be positioned under a surface of the substrate.

The contact plug may include a first contact plug and a second contact plug which are disposed at opposite sides of the first gate, respectively, and the device may further include: a resistance variable element that is connected to the first contact plug.

The resistance variable element may include: a single layer or a multi-layer including metal oxide, phase change material, ferroelectric material, or ferromagnetic material.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In yet another aspect, an electronic device having different types of transistors comprises a semiconductor memory, wherein the semiconductor memory includes: a resistance variable element responsive to an applied control signal to be in two different resistance values for storing data, a first region and second region in a substrate, a first transistor coupled to the resistance variable element and having a first gate in the first region in a first transistor configuration in which the first gate is buried in the substrate, and a second transistor being part of a circuit of the semiconductor memory and having a second gate in the second region in a second transistor configuration that is different from the first transistor configuration where the second gate is located on the substrate and without being buried in the substrate, wherein a height of a surface of a gate protection layer formed on the first gate is substantially same as a height of a surface of the second gate.

Implementations of the above electronic device may include one or more the following.

The electronic device comprises an isolation layer in the first region of the substrate to define active regions which include a portion protruding from the isolation layer. The first gate surrounds the protruded portion of the active regions. The resistance variable element is a magnetic random access memory.

These and other aspects, implementations and associated advantages are described in greater detail in the drawings, the description and the claims.

DETAILED DESCRIPTION

Figure 1A:
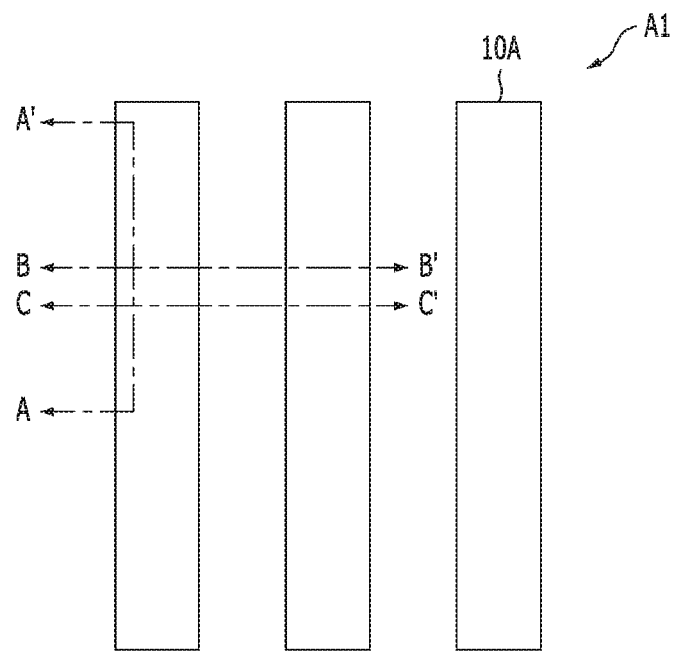
FIGS. 1A to 7B are diagrams for explaining a semiconductor device and a method for fabricating the semiconductor device.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1A to 7B are diagrams for explaining a semiconductor device and a method for fabricating the same in accordance with one implementation of the patent document. Particularly, the semiconductor device of the present implementation may include a first region A1 and a second region A2 including different types of transistors, respectively. For example, the first region A1 may include a transistor of a first type having a first gate buried in a substrate, and the second region A2 may include a transistor of a second type having a second gate arranged on the substrate. The semiconductor device of the present implementation may include a resistance variable element that is connected to one end of the transistor of the first region A1 and has a characteristic switched between different resistance states according to a voltage and a current applied to both ends thereof. In the present drawings, FIG. 1A, FIG. 2A, FIG. 3A, FIG. 4A, and FIG. 7A illustrate plan views of the first region A1 in illustrated examples. FIG. 1B, FIG. 2B, FIG. 3B, FIG. 4B, FIG. 5, FIG. 6, and FIG. 7B illustrate sectional views taken along lines A-A', B-B', and C-C' of FIG. 1A and sectional views of the second region A2 in illustrated examples.

Figure 1B:
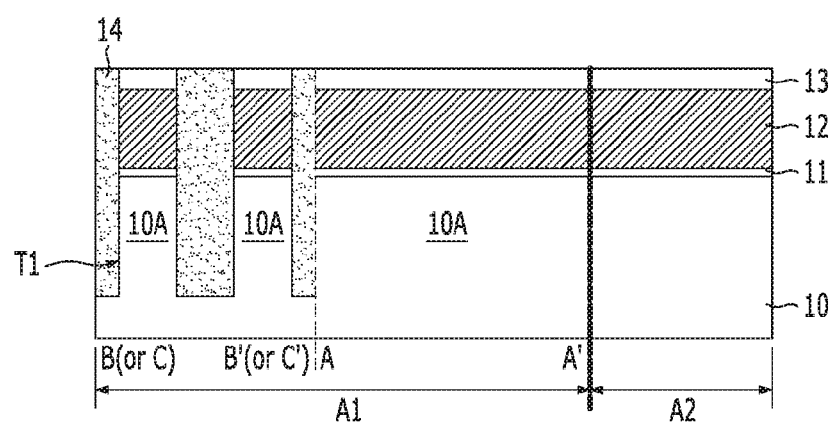

Referring to FIG. 1A and FIG. 1B, a substrate 10 including the first region A1 and the second region A2 is provided.

The substrate 10 may include a semiconductor material such as silicon. The first region A1 may include a plurality of memory cells, for example, a cell region in which a plurality of resistance variable elements are formed. The second region A2 may include a peripheral circuit region.

Next, an etching stop layer 11, a sacrificial layer 12, and a hard mask layer 13 are formed on the substrate 10. The etching stop layer 11 has etching selectivity with regard to the sacrificial layer 12, and for example, may include an oxide layer such as a silicon oxide layer or an aluminum oxide layer. The sacrificial layer 12, for example, may include a carbon-containing layer such as an amorphous carbon layer, a layer containing silicon such as multi-crystalline silicon, or a nitride layer such as a silicon nitride layer or a silicon oxide nitride layer. However, other implementations are possible.

Then, the hard mask layer 13, the sacrificial layer 12, and the etching stop layer 11 which are formed on the first region A1 are selectively etched to expose the substrate 10. The substrate exposed is etched to a predetermined thickness so that an isolation trench T1 for defining an active region 10A of the substrate 10 is formed in the first region A1. In the present implementation, the active region 10A may have a line shape extending in a first direction parallel to the line A-A'. However, other implementations are possible. For example, the active region 10A may have various shapes in other configurations. In the present implementation, the isolation trench T1 is illustrated to be formed in the first region A1. In other implementations, the isolation trench T1 may be formed in the second region A2 as well as the first region A1.

Then, an isolation layer 14 is formed to be buried in the isolation trench T1. The isolation layer 14 may be formed by forming an insulating material covering a resultant structure including the isolation trench T1, and then performing a planarization process, for example, CMP (chemical mechanical polishing) until the hard mask layer 13 is exposed.

Figure 2A:
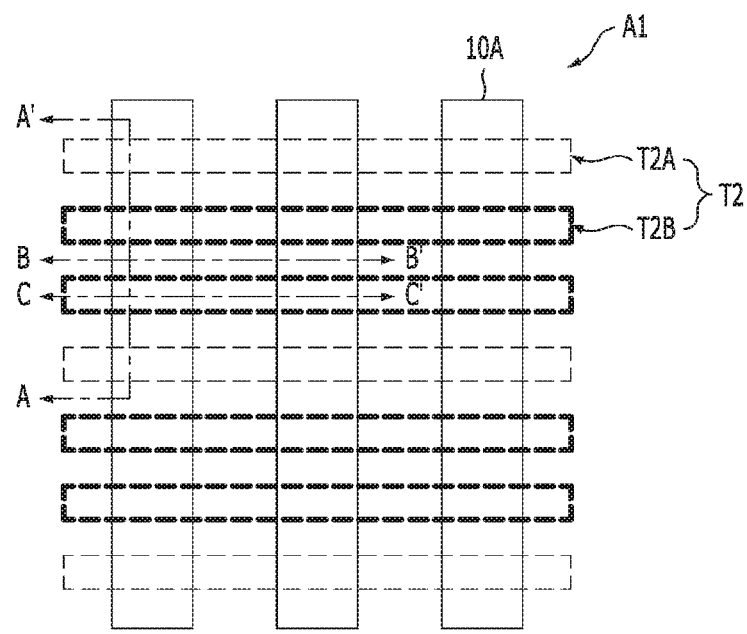
Figure 2B:
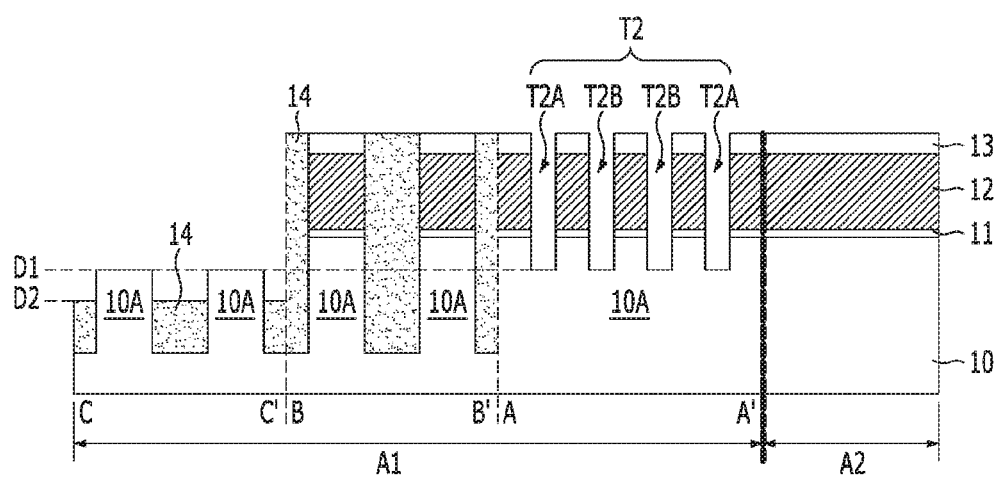

Referring to FIG. 2A and FIG. 2B, a mask pattern (not illustrated) is formed on the resultant structure as shown in FIG. 1A and FIG. 1B. The mask pattern may be used to expose a region in which the first gate of the first region A1 is to be formed. The hard mask layer 13, the sacrificial layer 12, the etching stop layer 11, and the substrate 10 are etched to a first depth D1 by using the mask pattern as an etching barrier thereby forming a trench T2 for a gate. The trench T2 provides a space in which the first gate, which will be described later, is to be formed, and may have a line shape extending in a second direction crossing the active region 10A. The first depth D1 of the trench T2 may be smaller than the depth of the isolation trench T1.

The etching of the trench T2 may be performed in such a manner that etching can be essentially stopped when the etching stop layer 11 is exposed. The exposed etching stop layer 11 is removed using a suitable technique such as an etching or cleaning process, and then the exposed substrate 10 is etched. Consequently, more precise etching can be realized.

The trench T2 may include first trenches T2A (shown as a thin dotted line in FIG. 2A) and second trenches T2B (shown as a thick dotted line in FIG. 2A). The first trench T2A and the second trench T2B provide structures for forming a first gate. For example, the second trench T2B may provide a space in which a first gate serves as a gate of a transistor, and the first trenches T2A may provide a space in which a first gate separates transistors adjacent in the first direction. In the present implementation, two second trenches T2B and one first trench T2A are alternately repeatedly arranged. For example, as illustrated in a specific example of FIG. 2A, the arrangement where a first trench T2A and a pair of second trenches T2B are alternately provided is repeated. However, other implementations are possible. For example, any number of second trenches T2B and an arbitrary number of first trenches T2A may be alternately arranged, or the first trench T2A may be omitted.

Since both the hard mask layer 13 and the isolation layer 14 have been exposed by the mask pattern, a part of the isolation layer 14 may also be etched when forming the trench T2. The isolation layer 14 can be etched to a second depth D2 greater than D1 of the trench T2 by using the mask pattern as an etching barrier, so that the active region 10A may protrude above the isolation layer 14 on the line C-C'. In such a case, since the first gate, which will be formed later, surrounds the protruded active region 10A on the line C-C', it is possible to significantly improve the current drivability of the transistor.

Figure 3A:
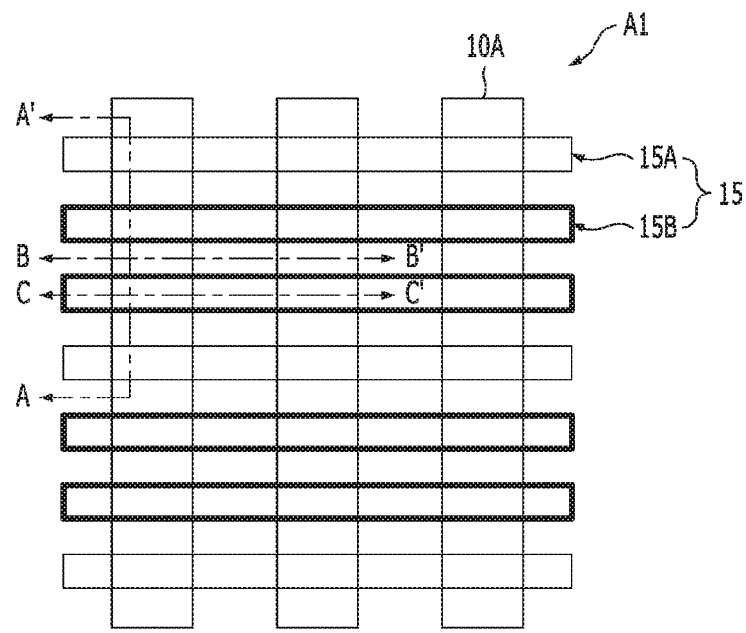
Figure 3B:
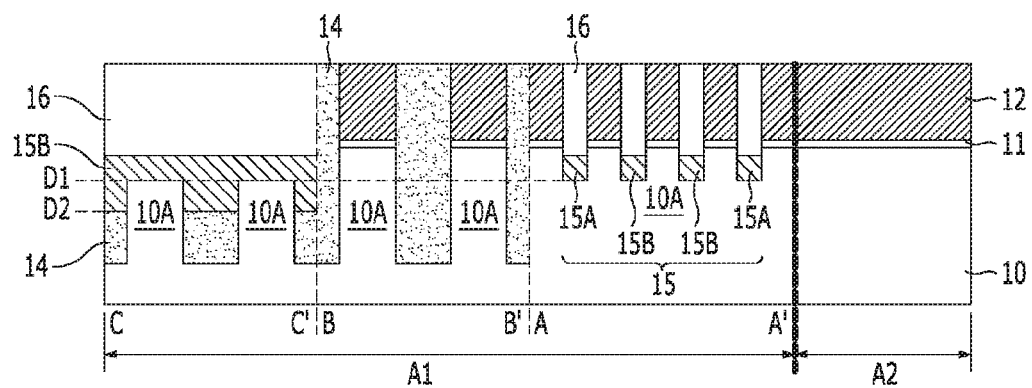

Referring to FIG. 3A and FIG. 3B, a first gate 15 is formed to fill a part of the trench T2. Conductive material for covering the resultant structure of FIG. 2A and FIG. 2B is formed, and then is etched back to a desired height. The upper surface of the first gate 15 may be equal to or less than the upper surface of the substrate 10. In such a case, it is possible to easily separate the first gate 15 from a conductive plug which will be formed later.

The first gate 15 may include first gates 15B buried in the second trenches T2B, which actually serve as the gate of the transistor, and first gates 15A buried in the first trenches T2A, which separate the transistors adjacent in the first direction. As with the present implementation, when the active region 10A protrudes above the isolation layer 14 on the line C-C', the first gate 15 is able to surround the active region 10A. For example, the first gate 15 may surround the top and the both sides of the protruded active region 10A.

Before the first gate 15 is formed, a gate insulating layer (not illustrated) may be formed between the active region 10A and the first gate 15. The process for forming the gate insulating layer may be performed by depositing an insulating layer along the resultant structure of FIG. 2A and FIG. 2B or performing a thermal oxidation process before filling the conductive material for forming the first gate 15

Then, a gate protection layer 16 for filling the remaining portion of the trench T2 is formed. The gate protection layer 16 may be positioned on the first gate 15 to protect the first gate 15.

The gate protection layer 16 may be formed by forming a material layer for forming the gate protection layer 16 on the resultant structure including the first gate 15, and then performing a planarization process, for example, a CMP process, until the sacrificial layer 12 is exposed. The material layer may have etching selectivity with regard to the etching stop layer 11 and the sacrificial layer 12.

Figure 4A:
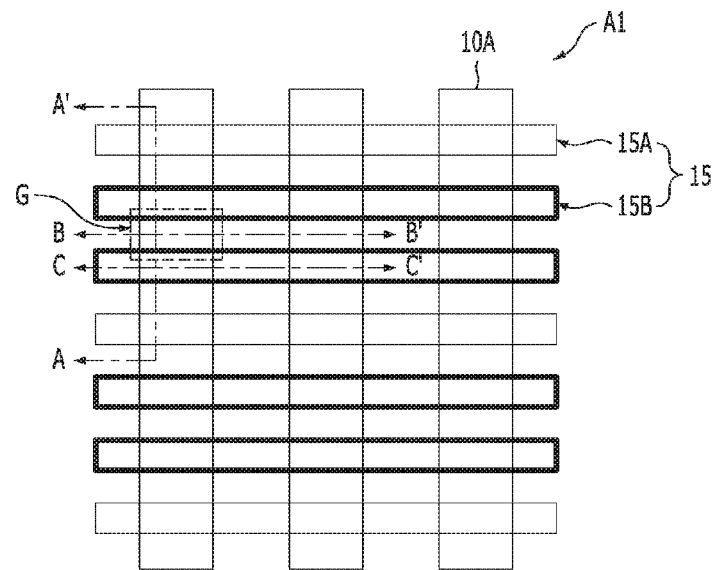
Figure 4B:
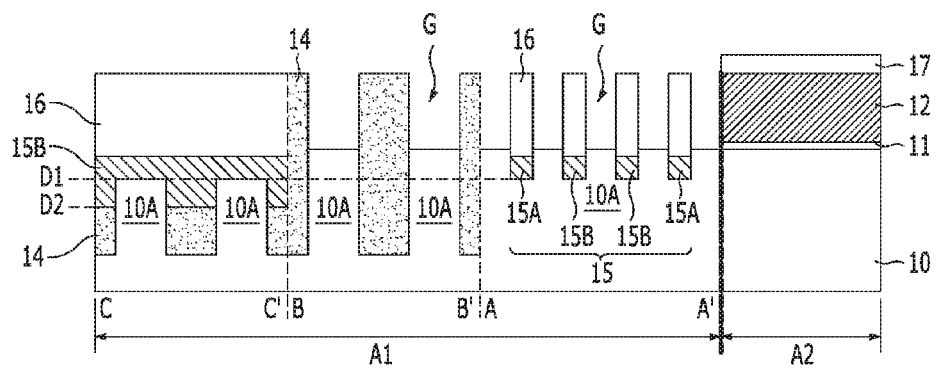

Referring to FIG. 4A and FIG. 4B, a first mask 17 for covering the second region A2 is formed, and then the sacrificial layer 12 of the first region A1 and the etching stop layer 11 under the sacrificial layer 12 are removed. The sacrificial layer 12 and the etching stop layer 11 may be removed using a dry or wet etching process. The first mask 17 may be formed using an insulating material. Hereinafter, a resultant structure formed after removing the sacrificial layer 12 and the etching stop layer 11 is referred to as a groove portion G. The groove portion G is surrounded by the isolation layer 14 and the gate protection layer 16.

Figure 5:
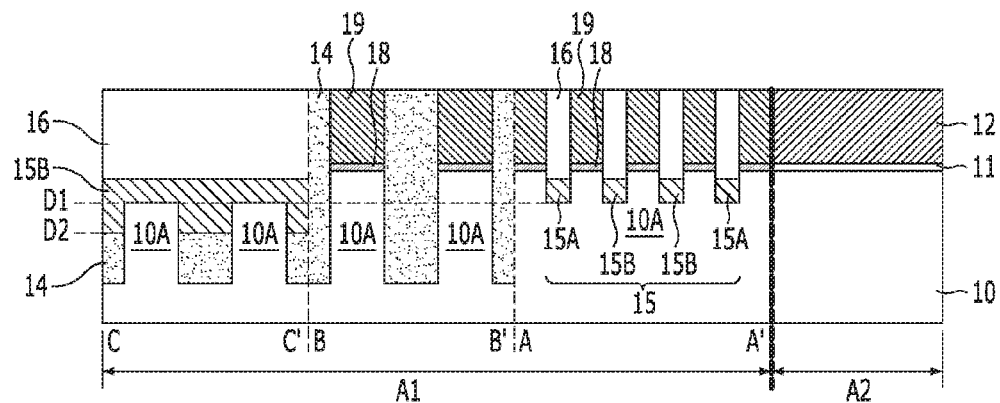

Referring to FIG. 5, a conductive plug 19 is formed to fill or cover the groove portion G. The conductive plug 19 may be arranged on the active region 10A at opposite sides of the first gate 15 and serve as a junction region of the transistor. The conductive plug 19 may include a metal-containing layer such as a metal layer, a metal nitride layer, or a metal semiconductor compound layer, and may be formed as a single layer or a multi-layer. For example, the conductive plug 19 may include a titanium silicon layer, a cobalt silicon layer, a nickel silicon layer, a titanium nitride layer, a dual layer of a titanium nitride layer and a titanium layer, a triple layer of a tungsten layer, a titanium nitride layer, and a titanium layer, and so on. In such a case, since the resistance of the conductive plug 19 is low, the resistance of the junction region of the transistor is reduced. Thus, it is possible to improve characteristic such as current drivability.

The conductive plug 19 may be formed by forming conductive material for covering the resultant structure of FIG. 4A and FIG. 4B, and then performing a planarization process until the isolation layer 14 or the gate protection layer 16 or the both is exposed. As one example of the present implementation, the aforementioned first mask 17 may be removed during the planarization process. Alternatively, the first mask 17 may be removed through a separate process before or after the conductive plug 19 is formed.

In the present implementation, a metal semiconductor compound layer 18 may be interposed between the conductive plug 19 and the active region 10A. The metal semiconductor compound layer 18 may include a titanium silicon layer, a cobalt silicon layer, a nickel silicon layer and so on.

Consequently, in the first region A1, the first gate 15 is buried in the substrate 10 and the transistors are formed at opposite sides of the first gate 15 to include the conductive plug 19.

Figure 6:
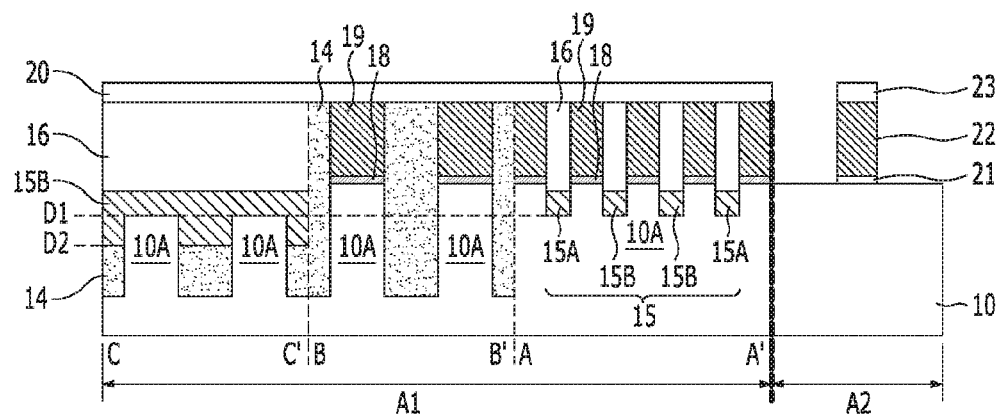

Referring to FIG. 6, a second mask 20 for covering the first region A1 is formed. The sacrificial layer 12 and the etching stop layer 11 of the second region A2 are removed. The second mask 20 may be formed using an insulating material.

Next, a gate insulating layer and a conductive layer for a second gate and an insulating layer for a second gate hard mask are sequentially formed on the substrate 10 of the second region A2, and are patterned to form a stacked structure of a gate insulating pattern 21, a second gate 22, and a second gate hard mask 23.

Then, although not illustrated in the drawing, a junction region (not illustrated) is formed in the substrate 10 at opposite sides of the second gate 22 by suitable techniques, for example, an ion implantation process. The second mask 20 may be removed through a separate removal process. When the second mask 20 has been formed using insulating material, the second mask 20 may be not removed.

Consequently, in the second region A2, a transistor can be formed to include the second gate 22 arranged on the substrate 10.

Figure 7A:
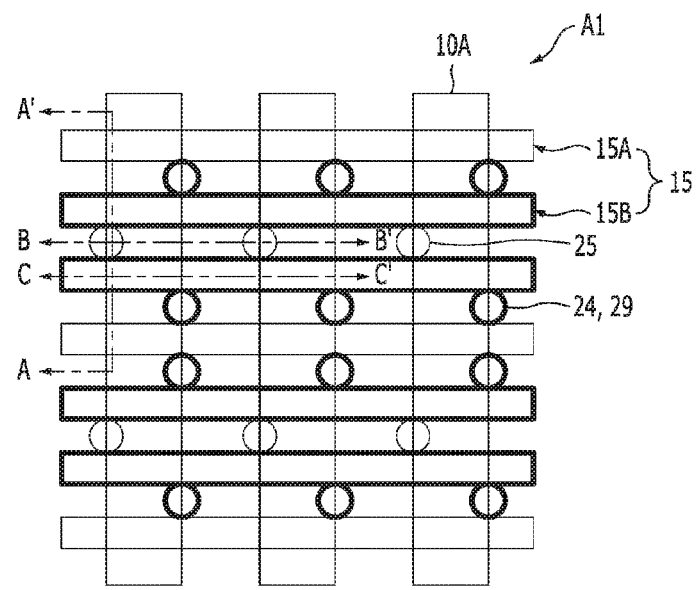
Figure 7B:
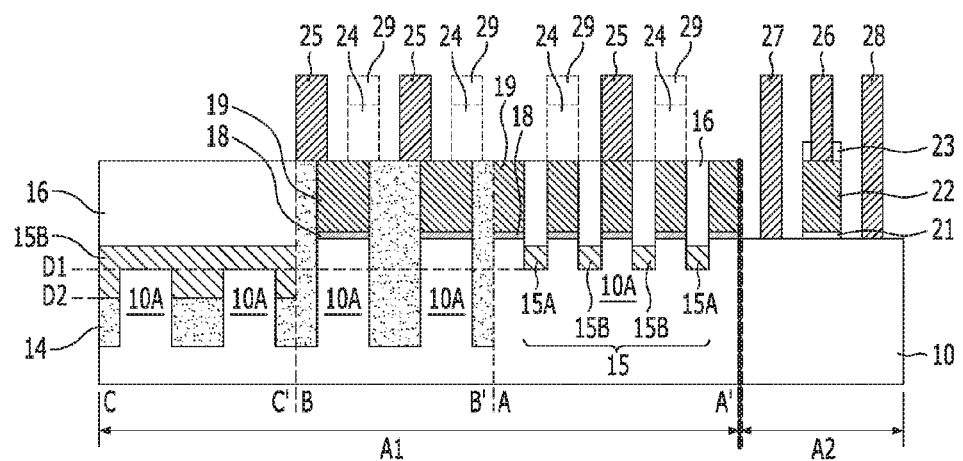

Referring to FIG. 7A and FIG. 7B, first contacts 24 and second contacts 25 are formed to be connected to the metal plugs 19 at opposite sides of the first gate 15. Since the first contact 24 is not shown from the views taken along the lines A-A' and B-B,' it is indicated by a dotted line in FIG. 7B.

Resistance variable elements 29 may be formed on the first contact 24. The resistance variable element 29 is an element having a characteristic switched between different resistance states according to a voltage and a current applied to both ends thereof, and may function as a data storing element using such a characteristic. For example, when the resistance variable element 29 is in a low resistance state, it may store data '0', and when the resistance variable element 29 is in a high resistance state, it may store data '1'. Such a resistance variable element 29 may be a single layer or a multi-layer including material used in a RRAM, a PRAM, a MRAM, a FRAM and so on, for example, transition metal oxide, metal oxide such as perovskite-based material, phase change material such as chalcogenide-based material, ferroelectric material, ferromagnetic material and so on. Particularly, when the resistance variable element 29 is a magnetic resistance element used in a MRAM, the resistance variable element 29 may include a structure in which a tunnel barrier layer is interposed between two magnetic layers.

Based on the above formed resistance variable element 29, a predetermined interconnection, for example, a bit line (not illustrated), may be formed on the resistance variable element 29 to be electrically connected to the resistance variable element 29. Another predetermined interconnection, for example, a source line (not illustrated), may be formed on the second contact 25 to be electrically connected to the second contact 25. The bit line may extend in the first direction while being connected to the resistance variable elements 29 arranged in the first direction. The source line may extend in the first direction while being connected to the second contacts 25 arranged in the first direction. Thus, the first contacts 24 and the second contacts 25 may not be positioned on the same straight line in the first direction as illustrated in FIGS. 7A and 7B. However, other implementations are possible. In various configurations, the positions of the contact and the interconnection may be variously modified.

Contacts may be formed for the second region A2. For example, a third contact 26 may be formed to be connected to the second gate 22, and fourth and fifth contacts 27 and 28 may be formed at opposite sides of the second gate 22 to be connected to the junction regions. The third to fifth contacts 26, 27, and 28 may be connected to interconnections (not illustrated).

Through the aforementioned processes, the semiconductor device as illustrated in FIG. 7A and FIG. 7B can be fabricated.

As shown in FIG. 7A and FIG. 7B, the substrate 10 includes the first region A1 and the second region A2.

In the first region A1, the first gate 15 is buried in the substrate 10. The gate protection layer 16 is arranged on the first gate 15 and protrudes above the substrate 10. The upper surface of the first gate 15 may be positioned below the substrate 10. However, other implementations are possible.

The conductive plug 19 including a metal-containing layer is arranged on the substrate 10 between the first gate 15 and the gate protection layer 16 of the first region A1. The metal semiconductor compound layer 18 may be further interposed between the conductive plug 19 and the substrate 10.

In the second region A2, the second gate 22 is arranged on the substrate 10. The gate insulating pattern 21 may be interposed between the second gate 22 and the substrate 10, and the second gate hard mask 23 may form on the second gate 22.

One end of the transistor including the first gate 15 and the conductive plug 19 of the first region A1, for example, may be connected to the resistance variable element 29 through the first contact 24, and the other end thereof, for example, may be connected to the predetermined interconnection, for example, the source line, through the second contact 25. The transistor including the second gate 22 of the second region A2 may also be connected to predetermined interconnections through the contacts 26, 27, and 28.

The above implementations may be sued to achieve the following advantages.

First, by using the sacrificial layer 12, more precise and accurate control is possible for the positions of the first gate 15 and the metal plug 19.

Furthermore, by using the sacrificial layer 12, even when a gate is formed in the first region A1 to be buried in the substrate 10 and a gate is formed in the second region A2 to be arranged on the substrate 10, it is possible to substantially avoiding a step difference between the two regions. Consequently, subsequent processes including, for example, a contact formation process, can be performed in an easier and simpler manner.

Moreover, since it is possible to use the conductive plug 19 including metal, the resistance of the junction region of the transistor can be minimized, thereby increasing a current supplied through the transistor. Such a transistor is suitable for a selective element of a resistance variable element, which requires the sufficient supply of a current for switching.

In the aforementioned implementation, the transistor of the first region has been described to drive a resistance variable element. However, other implementations are possible. The transistor of the first region may be connected to various elements, for example, a capacitor and so on of a DRAM. Furthermore, the characteristics of the first region 10A and the first gate 15 including, for example, shapes can be variously modified in other configurations.

The above and other memory circuits or semiconductor devices based on the disclosed technology can be used in a range of devices or systems. FIGS. 8-12 provide some examples of devices or systems that can implement the memory circuits disclosed herein.

Figure 8:
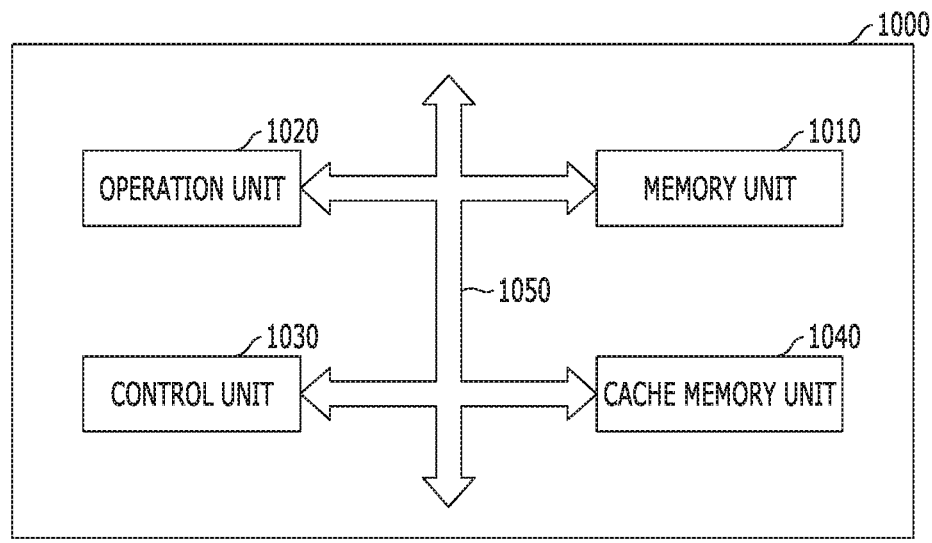
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate including a first region and a second region; a stacked structure of a first gate and a gate protection layer that are formed in the first region such that a part of the stacked structure is buried in the substrate; a conductive plug disposed on the substrate of the first region and in at a side of the stack structure; and a second gate disposed on the substrate of the second region. Through this, characteristics of a transistor of the memory unit 1010 may be improved, and the degree of process difficulty in fabricating the memory unit 1010 may be reduced by substantially avoiding a step difference between the first region and second region. Thus, if the transistor is coupled to a memory element, for example, a resistance variable element, the data storage characteristics of the memory unit 1010 can be improved. As a consequence, a fabrication process of the microprocessor 1000 may become easier and simpler and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
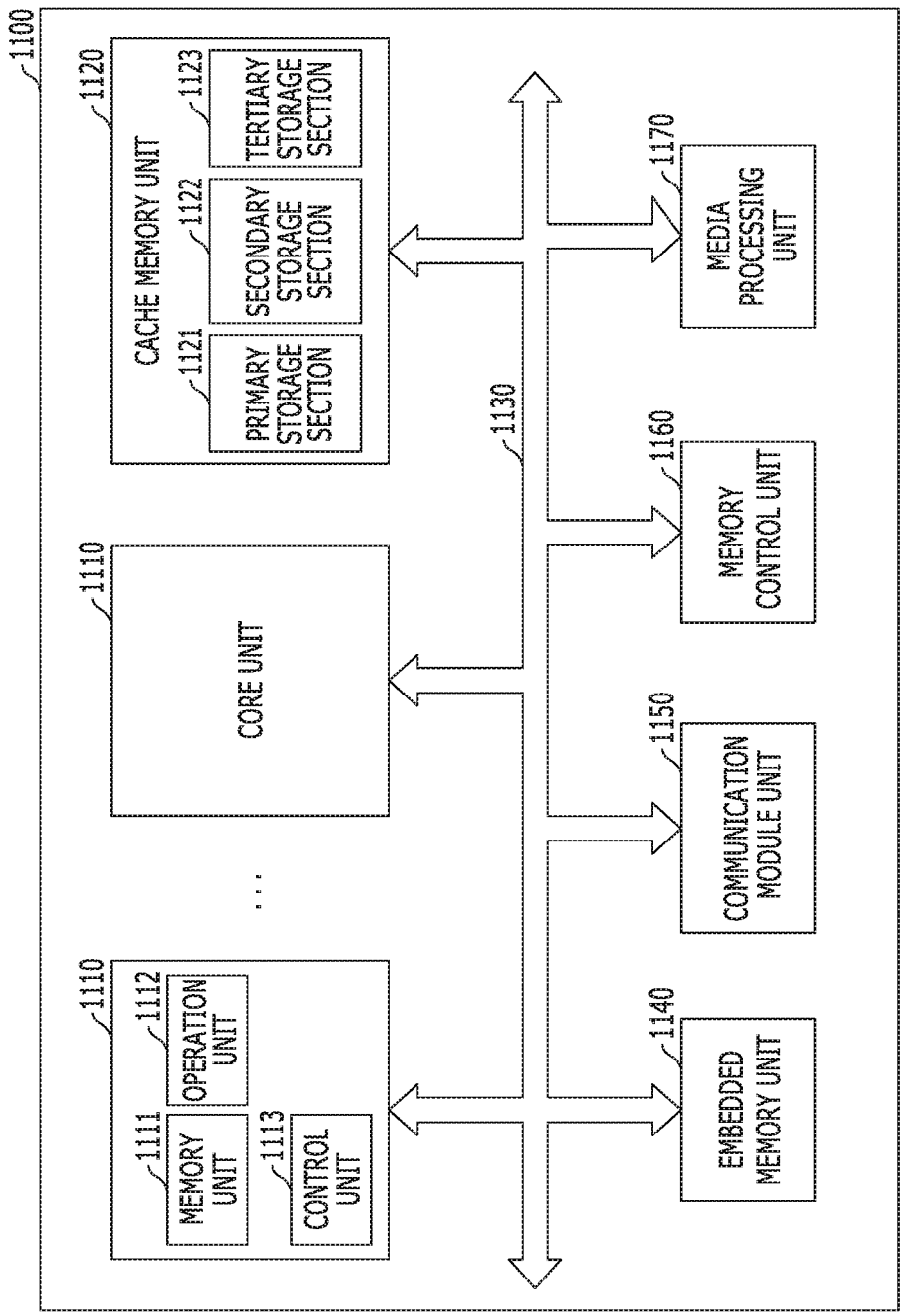
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate including a first region and a second region; a stacked structure of a first gate and a gate protection layer that are formed in the first region such that a part of the stacked structure is buried in the substrate; a conductive plug disposed on the substrate of the first region and in at a side of the stack structure; and a second gate disposed on the substrate of the second region. Through this, characteristics of a transistor of the cache memory unit 1120 may be improved, and the degree of process difficulty in fabricating the cache memory unit 1120 may be reduced by substantially avoiding a step difference between the first region and the second regions. Thus, if the transistor is coupled to a memory element, for example, a resistance variable element, the data storage characteristics of the cache memory unit 1120 can be improved. As a consequence, a fabrication process of the processor 1100 may become easier and simpler, and performance characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
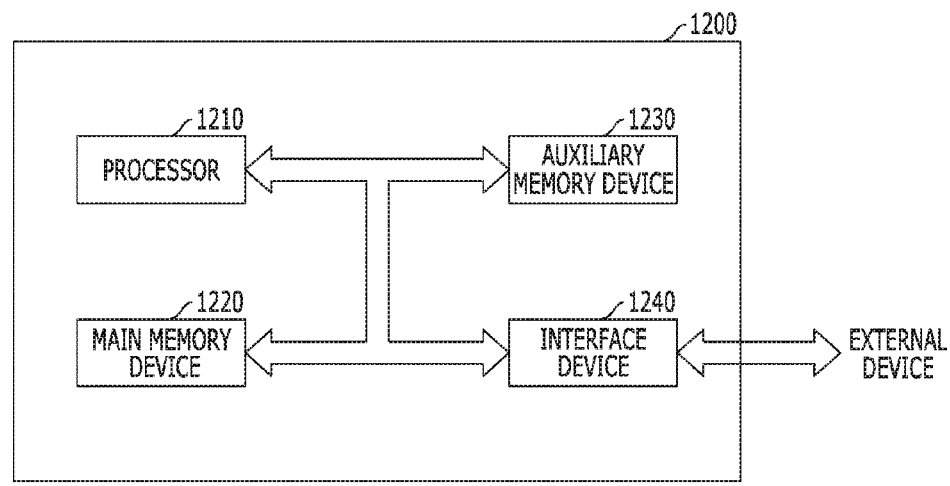
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate including a first region and a second region; a stacked structure of a first gate and a gate protection layer that are formed in the first region such that a part of the stacked structure is buried in the substrate; a conductive plug disposed on the substrate of the first region and in at a side of the stack structure; and a second gate disposed on the substrate of the second region. Through this, characteristics of a transistor of the main memory device 1220 may be improved, and the degree of process difficulty in fabricating the main memory device 1220 may be reduced by substantially avoiding a step difference between the first region and the second region. Thus, if the transistor is coupled to a memory element, for example, a resistance variable element, the data storage characteristics of the main memory device 1220 can be improved. As a consequence, a fabrication process of the system 1200 may become easier and simpler, and performance characteristics of the system 1200 can be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate including a first region and a second region; a stacked structure of a first gate and a gate protection layer that are formed in the first region such that a part of the stacked structure is buried in the substrate; a conductive plug disposed on the substrate of the first region and in at a side of the stack structure; and a second gate disposed on the substrate of the second region. Through this, characteristics of a transistor of the auxiliary memory device 1230 may be improved, and the degree of process difficulty in fabricating the auxiliary memory device 1230 may be reduced by substantially avoiding a step difference between the first region and the second region. Thus, if the transistor is coupled to a memory element, for example, a resistance variable element, the data storage characteristics of the auxiliary memory device 1230 can be improved. As a consequence, a fabrication process of the system 1200 may become easier and simpler, and performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
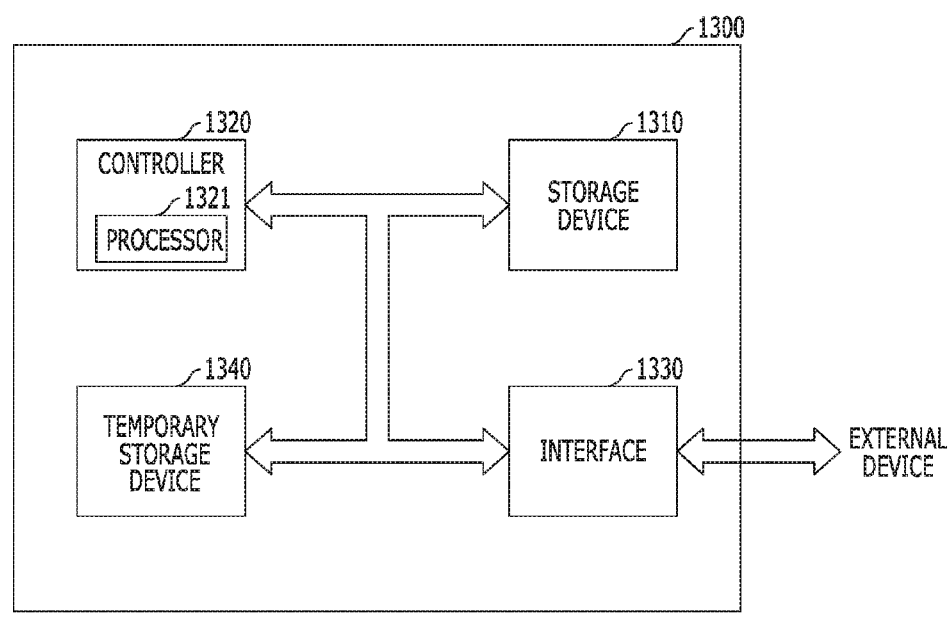
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate including a first region and a second region; a stacked structure of a first gate and a gate protection layer that are formed in the first region such that a part of the stacked structure is buried in the substrate; a conductive plug disposed on the substrate of the first region and in at a side of the stack structure; and a second gate disposed on the substrate of the second region. Through this, characteristics of a transistor of the temporary storage device 1340 may be improved, and the degree of process difficulty in fabricating the temporary storage device 1340 may be reduced by substantially avoiding a step difference between the first region and the second region. Thus, if the transistor is coupled to a memory element, for example, a resistance variable element, the data storage characteristics of the temporary storage device 1340 can be improved. As a consequence, a fabrication process of the data storage system 1300 may become easier and simpler, and performance characteristics of the data storage system 1300 may be improved.

Figure 12:
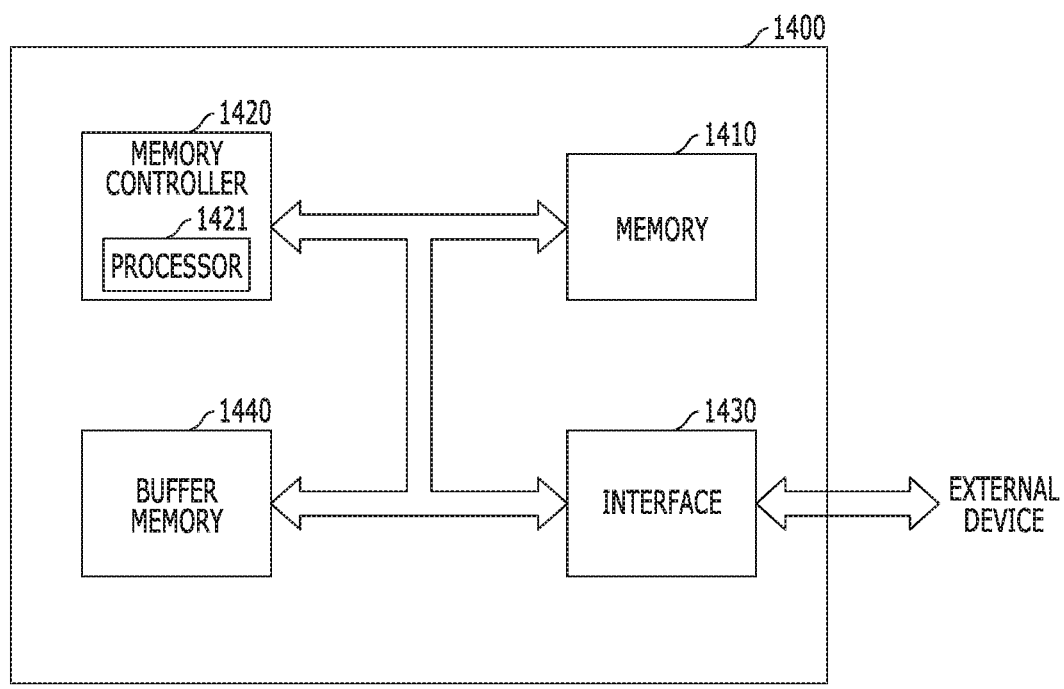
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate including a first region and a second region; a stacked structure of a first gate and a gate protection layer that are formed in the first region such that a part of the stacked structure is buried in the substrate; a conductive plug disposed on the substrate of the first region and in at a side of the stack structure; and a second gate disposed on the substrate of the second region. Through this, characteristics of a transistor of the memory 1410 may be improved, and the degree of process difficulty in fabricating the memory 1410 may be reduced by substantially avoiding a step difference between the first region and the second region. Thus, if the transistor is coupled to a memory element, for example, a resistance variable element, the data storage characteristics of the memory 1410 can be improved. As a consequence, a fabrication process of the memory system 1400 may become easier and simpler, and performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate including a first region and a second region; a stacked structure of a first gate and a gate protection layer that are formed in the first region such that a part of the stacked structure is buried in the substrate; a conductive plug disposed on the substrate of the first region and in at a side of the stack structure; and a second gate disposed on the substrate of the second region. Through this, characteristics of a transistor of the buffer memory 1440 may be improved, and the degree of process difficulty in fabricating the buffer memory 1440 may be reduced by substantially avoiding a step difference between the first region and the second region. Thus, if the transistor is coupled to a memory element, for example, a resistance variable element, the data storage characteristics of the buffer memory 1440 can be improved. As a consequence, a fabrication process of the memory system 1400 may become easier and simpler, and the performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device having different types of transistors, comprising:
   a semiconductor memory comprising:

a resistance variable element responsive to an applied control signal to be in two different resistance values for storing data, a first region and second region in a substrate, a first transistor coupled to the resistance variable element and having a first gate in the first region in a first transistor configuration in which the first gate is buried in the substrate, and a second transistor being part of a circuit of the semiconductor memory and having a second gate in the second region in a second transistor configuration that is different from the first transistor configuration where the second gate is located on the substrate and without being buried in the substrate, wherein a height of a surface of a gate protection layer formed on the first gate is substantially same as a height of a surface of the second gate.

2. The electronic device of claim 1, comprising an isolation layer in the first region of the substrate to define active regions which include a portion protruding from the isolation layer.

3. The electronic device of claim 2, wherein the first gate surrounds the protruded portion of the active regions.

4. The electronic device of claim 1, wherein the resistance variable element is a magnetic random access memory.

5. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

6. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

7. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

8. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

9. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

* * * * *